(12) United States Patent
Zhang

(10) Patent No.: US 11,854,577 B2
(45) Date of Patent: Dec. 26, 2023

(54) HARD DISK DEVICE SIMULATOR, TESTING SYSTEM USING HARD DISK DEVICE SIMULATORS AND TESTING METHOD THEREOF

(71) Applicants: Inventec (Pudong) Technology Corporation, Shanghai (CN); Inventec Corporation, Taipei (TW)

(72) Inventor: Tian-Chao Zhang, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 238 days.

(21) Appl. No.: 17/484,746

(22) Filed: Sep. 24, 2021

(65) Prior Publication Data

US 2023/0081758 A1    Mar. 16, 2023

(30) Foreign Application Priority Data

Sep. 16, 2021    (CN) .......................... 202111085306.8

(51) Int. Cl.
*G11B 19/04*    (2006.01)
*G06F 30/20*    (2020.01)

(52) U.S. Cl.
CPC ............ *G11B 19/048* (2013.01); *G06F 30/20* (2020.01); *G11B 2220/2516* (2013.01)

(58) Field of Classification Search
None
See application file for complete search history.

(56) References Cited

U.S. PATENT DOCUMENTS

| | | | | |
|---|---|---|---|---|
| 7,685,380 B1* | 3/2010 | Khu | .................... | H03K 19/1776 |
| | | | | 711/102 |
| 7,702,480 B2* | 4/2010 | Beecher | ............. | G01R 31/2806 |
| | | | | 702/120 |
| 10,810,338 B1* | 10/2020 | Mu | ................ | G01R 31/318583 |
| 2002/0133765 A1* | 9/2002 | Antosh | .................. | G11C 29/48 |
| | | | | 711/104 |
| 2006/0282722 A1* | 12/2006 | Co | ......................... | G11C 29/56 |
| | | | | 714/724 |
| 2008/0270857 A1* | 10/2008 | Huang | .................. | G06F 30/394 |
| | | | | 714/E11.155 |
| 2009/0006915 A1* | 1/2009 | Gomez | ............... | G06F 11/2236 |
| | | | | 714/E11.155 |
| 2014/0164858 A1* | 6/2014 | Luo | .................... | G01R 31/2806 |
| | | | | 714/726 |

(Continued)

*Primary Examiner* — Fred Tzeng
(74) *Attorney, Agent, or Firm* — David R. Stevens; Stevens Law Group

(57) ABSTRACT

A hard disk device simulator, a testing system using the hard disk device simulator and a testing method thereof are disclosed. The hard disk device simulator having a detection circuit is serially connected to a test port of a device under test, and a test program is executed on the device under test to read a signal link status of an insertion slot of the device under test and transmit a detection command through the test port, to drive a detection circuit of the hard disk device simulator to detect signals on a power pin, a clock pin and a system management bus, to generate a detection result, thereby verifying correctness of the device under test based on the signal link status and the detection result. As a result, the technical effect of reducing the cost of testing the device under test can be achieved.

4 Claims, 4 Drawing Sheets

(56) References Cited

U.S. PATENT DOCUMENTS

| | | | |
|---|---|---|---|
| 2015/0012787 A1* | 1/2015 | Tarsi | G11C 29/50004 |
| | | | 714/721 |
| 2016/0282414 A1* | 9/2016 | Gielarowski | G01R 31/31723 |
| 2018/0128872 A1* | 5/2018 | Petrov | G01R 1/07378 |
| 2019/0178940 A1* | 6/2019 | Duan | G01R 31/31706 |
| 2020/0182932 A1* | 6/2020 | Wang | G01R 31/31715 |

* cited by examiner

(12) United States Patent

HARD DISK DEVICE SIMULATOR, TESTING SYSTEM USING HARD DISK DEVICE SIMULATORS AND TESTING METHOD THEREOF

BACKGROUND OF THE INVENTION

Cross-Reference to Related Application

This application claims the benefit of Chinese Application Serial No. 202111085306.8, filed Sep. 16, 2021, which is hereby incorporated herein by reference in its entirety.

1. Field of the Invention

The present invention relates to a monitoring and controlling system and a method thereof, testing system using hard disk device simulator and a testing method thereof.

2. Description of the Related Art

In recent years, with the popularity and vigorous development of automated testing technology, many manufacturers have applied this technology to the production line. However, in actual testing, some necessary components are required to match the automated testing process, and it results in high testing costs and difficult maintenance. Therefore, it has become a problem that manufacturers in the industry urgently want to solve.

Generally speaking, when a user wants to test a hard disk port (such as NVMe port) of a device under test (DUO, the required component is a hard disk. When the device under test has multiple hard disk ports to be tested at the same time, the user needs to prepare a corresponding number of actual hard disks, and set the hard disks in the device under test for testing. However, a large number of actual hard disks are not only difficult to maintain, but also make the testing cost high. More particularly, the hard disk has physical limitations on the number of reads and writes, so long-term testing will greatly shorten the life of the hard disk. Therefore, the conventional testing method has the problem of high cost in testing the device under test.

According to the above-mentioned contents, what is needed is to develop an improved solution to solve the conventional technology problem of high cost in testing the device under test.

SUMMARY OF THE INVENTION

An objective of the present invention is to provide a hard disk device simulator, testing system using hard disk device simulator and a testing method thereof, so as to solve the conventional technology problem.

In order to achieve the objective, the present invention discloses a hard disk device simulator including a circuit board and a detection circuit. An end of the circuit board is permitted to electrically connect to a device under test, and the circuit board includes a first port and a set of second ports disposed on other end thereof, the first port is permitted to electrically connect to a first port of another hard disk device simulator through a cable; when the first ports of the hard disk device simulator and the another hard disk device simulator are connected to each other through the cable, bus signals of two digital signal processors disposed on the device under test and corresponding to the hard disk device simulator and the another hard disk device simulator are linked to each other, and a processing unit of the device under test and the two digital signal processors form a loop, the set of second ports is permitted to serially connect to another hard disk device simulator and the device under test through at least one transmission line. The detection circuit is disposed on the circuit board and electrically connected to a plurality of pins. The plurality of pins include at least one power pin, at least one clock pin and a system management bus, and the detection circuit includes an analog-to-digital converter, an electrically erasable programmable read-only memory (EEPROM) and a complex programmable logic device (CPLD). The analog-to-digital converter is electrically connected to the at least one power pin and configured to read a voltage on the at least one power pin. The electrically erasable programmable read-only memory (EEPROM) is electrically connected to the system management bus and configured to store bus data transmitted on the system management bus, and permit the device under test to access the bus data to verify correctness of the system management bus. The complex programmable logic device (CPLD) is electrically connected to the clock pin and configured to receive a clock signal and read a frequency of the clock signal through the set of second ports, so as to verify correctness of the clock signal.

In order to achieve the objective, the present invention discloses a testing system using hard disk device simulators, the testing system includes a plurality of hard disk device simulators and a device under test. Each of the plurality of hard disk device simulators includes a first port, a set of second ports, and a detection circuit, the detection circuit is electrically connected to at least one power pin, at least one clock pin and a system management bus. When receiving a detection command, one of the plurality of hard disk device simulators drives the detection circuit to detect signals on the at least one power pin, the at least one clock pin and the system management bus, to generate and transmit a detection result. The device under test includes a plurality of insertion slots, a test port and a processing unit. One of the plurality of insertion slots is electrically connected to a digital signal processor corresponding thereto, and when the plurality of hard disk device simulators are respectively inserted into the plurality of insertion slots and the plurality of insertion slots are serially connect to the first ports of the plurality of hard disk device simulators through cables respectively, bus signals of the plurality of digital signal processors corresponding to the plurality of hard disk device simulators are linked. The test port is serially connected to the sets of second ports of the plurality of hard disk device simulators respectively inserted to the plurality of insertion slots through a plurality of transmission lines. The processing unit is electrically connected to the test port and the plurality of digital signal processors. The processing unit, the plurality of hard disk device simulators serially connected through the cables and respectively inserted to the plurality of insertion slots, and the plurality of digital signal processors corresponding to the plurality of hard disk device simulators form a loop. The processing unit executes a test program to read a signal link status on each of the plurality of insertion slots, transmit a detection command to all of the plurality of hard disk device simulators, which are serially connected through the plurality of transmission lines, through a test port, and receive the signal link statuses and the detection results generated by the plurality of hard disk device simulators, to verify and output correctness of the device under test.

In order to achieve the objective, the present invention discloses a testing method using hard disk device simulators, and the resting method includes steps of: providing a device under test and a plurality of hard disk device simulators, wherein the device under test comprise a plurality of insertion slots, a test port and a processing unit, each of the plurality of hard disk device simulators comprises a first port, a set of second ports and a detection circuit, and the detection circuit is electrically connected to at least one power pin, at least one clock pin and a system management bus; inserting the plurality of hard disk device simulators into the plurality of insertion slots, respectively, and serially connecting to the first ports of the plurality of hard disk device simulators through at least one cable, to link bus signals of two digital signal processors disposed on the device under test and corresponding to two of the plurality of hard disk device simulators and form a loop between the two digital signal processors and the processing unit of the device under test, and serially connecting the sets of the second ports of the plurality of hard disk device simulators and the test port of the device under test through a plurality of transmission lines; using the device under test to execute a test program to read a signal link status of each of the plurality of insertion slots and transmit a detection command to all of the plurality of hard disk device simulators, which are serially connected to each other through the plurality of transmission lines, through the test port; when one of the plurality of hard disk device simulators receives the detection command, driving the detection circuit to detect signals on the at least one power pin, the at least one clock pin and the system management bus, to generate a detection result and transmit the generated detection result to the test program; and using the test program to receive the signal link statuses and the detection results generated by the plurality of hard disk device simulators, to verify and output correctness of the device under test.

According to the device, the system and method of the present invention, the difference between the conventional technology and the present invention is that the hard disk device simulator having a detection circuit is provided to serially connect to the test port of the device under test, and the test program is executed on the device under test to read the signal link status of the insertion slot of the device under test and transmit the detection command through the test port, to drive the detection circuit of the hard disk device simulator to detect signals on the power pin, the clock pin and the system management bus, so as to generate a detection result, thereby verifying correctness of the device under test based on the signal link status and the detection result.

As a result, the above-mentioned technical solution of the present invention is able to achieve the technical effect of reducing the cost of testing the device under test.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
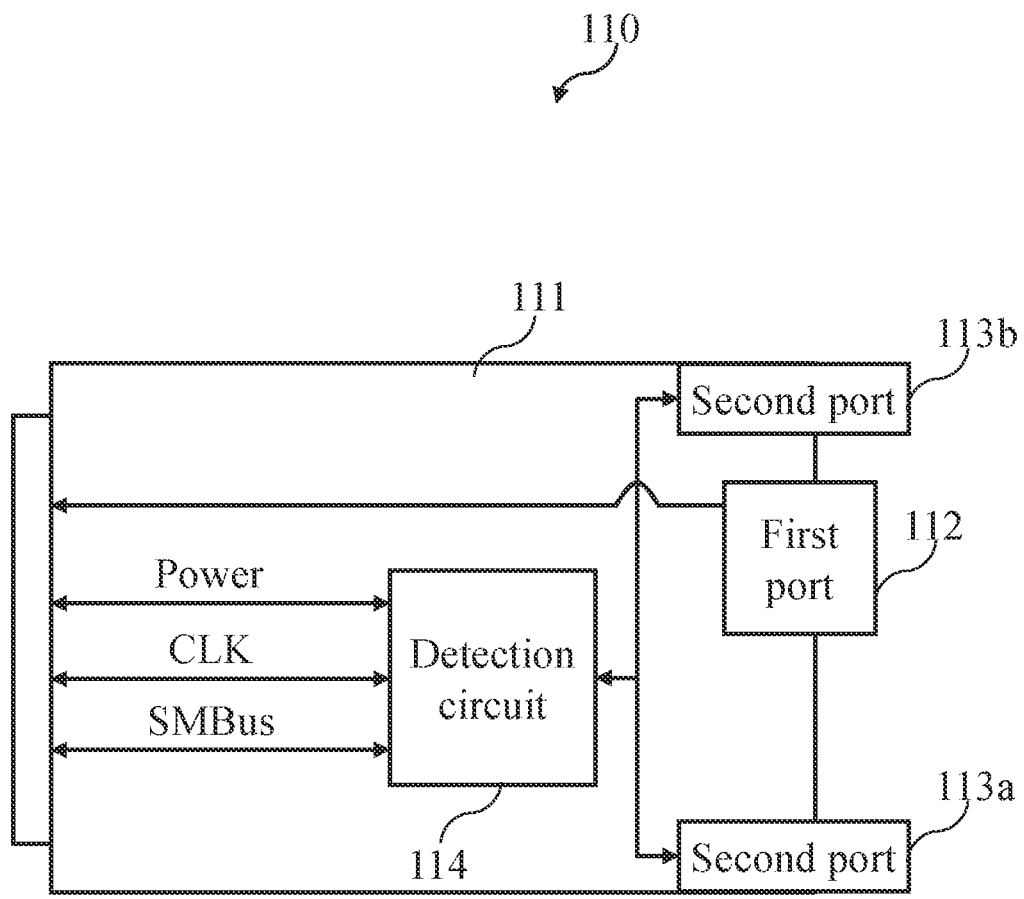
FIG. 1 is a block diagram of a hard disk device simulator of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

Please refer to FIG. 1, which is a block diagram of a hard disk device simulator of the present invention. A hard disk device simulator 110 includes a circuit board 111 and a detection circuit 114. An end of the circuit board 111 is permitted to electrically connect to a device under test. The circuit board 111 includes a first port 112 and a set of second ports 113*a* and 113*b* disposed on other end thereof, and the first port 112 is permitted to electrically connect the first port 112 of another hard disk device simulator 110 through a cable. When the test ports of two hard disk device simulators are connected to the cable, bus signals of two digital signal processors, which are disposed on a device under test and corresponding to the two hard disk device simulators 110 are linked, such as PCIe signal link, and the two digital signal processors and a processing unit of the device under test form a loop. The second ports 113*a* and 113*b* are permitted to serially connect to other hard disk device simulator 110 and the device under test through transmission lines. In actual implementation, the ends of the circuit board 111 electrically connected to the device under test is a connector matching the NMe specification or other similar specification, and is configured to connect to the NVMe insertion slot or the like of the device under test; furthermore, the first port can be a flexible flat cable (FFC) connector or the like; the cable can be a flexible flat cable or the like. The second port can be an RS232 serial port or the like, and the transmission line can be a RS232 transmission line or the like.

The detection circuit 114 is disposed on the circuit board 111 and electrically connected to a plurality of pins, for example, the plurality of pins include a power pin, a clock pin (UK), and a system management bus (SMBus). The detection circuit 114 includes an analog-to-digital converter, an electrically erasable programmable read-only memory (EEPROM), and a complex programmable logic device (CPLD). The analog-to-digital converter is electrically connected to the power pin and configured to read a voltage on the power pin. For example, each power pin is electrically connected to the analog-to-digital converter individually, the analog-to-digital converter is used to read a voltage on each pin, and the test program determines whether the voltage matches with the specification, so as to check the status of each power pin.

The EEPROM is electrically connected to the system management bus and configured to store bus data transmitted on the system management bus, and permit the device under test to access the bus data, so as to verify correctness of the system management bus. For example, the data stored in the EEPROM is accessed by the test program to verify correctness of the system management bus.

The complex programmable logic device (CPLD) is electrically connected to the clock pin and configured to receive a clock signal, and read the frequency of the clock signal through the set of second ports 113a and 113b, so as to verify correctness of the frequency of the clock signal. An RS232 port is taken as an example of the second port, the complex programmable logic device (CPLD) receives CLK signal of 100 MHz, and also reads the frequency of the CLK signal through RS232 port, so as to verify the correctness of the CLK signal.

Figure 2:
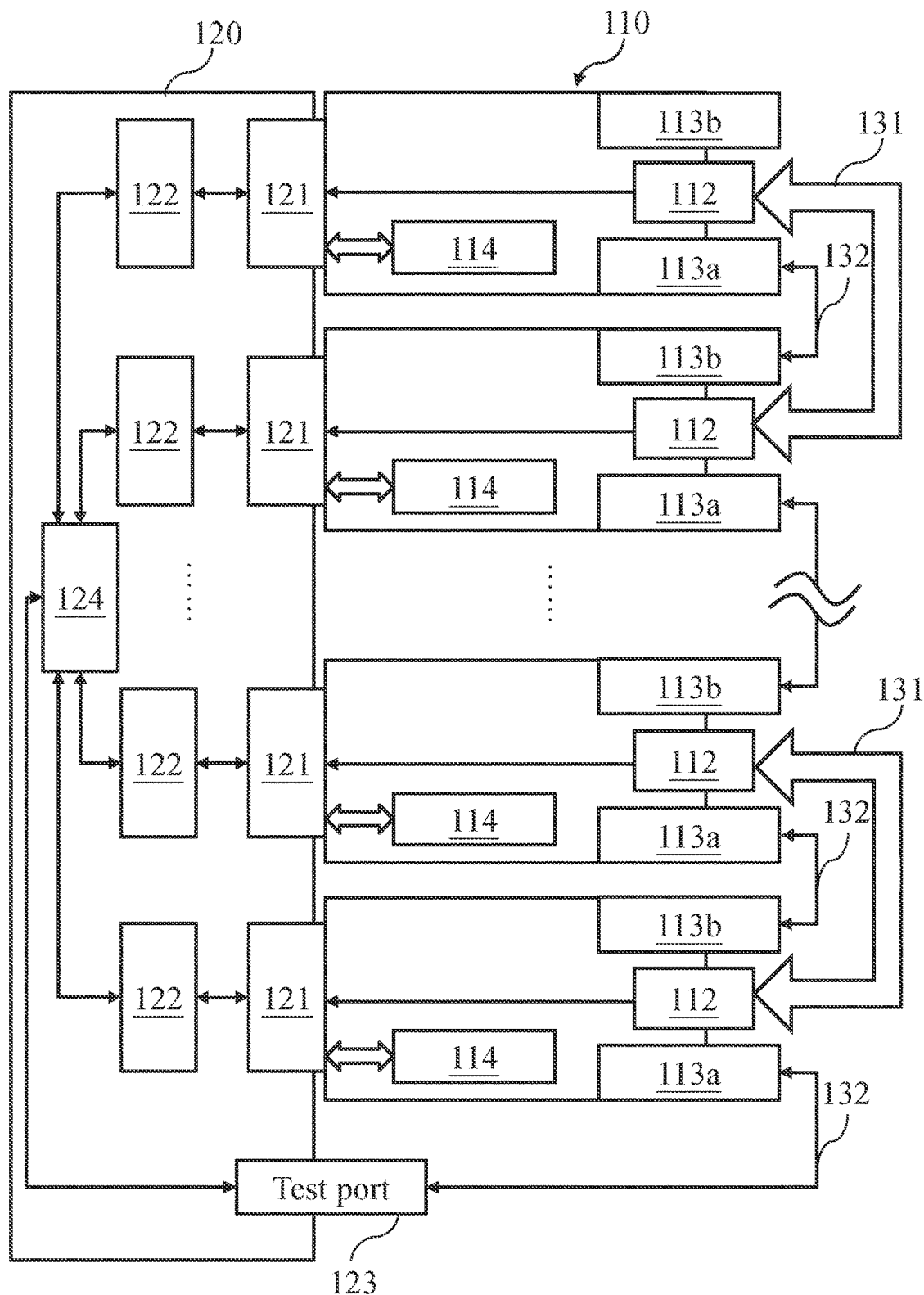
FIG. 2 is a system block diagram of a test system using hard disk device simulators, according to the present invention.

As shown in FIG. 2, which is a system block diagram of a test system using a hard disk device simulator, according to the present invention. As shown in FIG. 2, the system includes the hard disk device simulators 110 and the DUT 120, each hard disk device simulator 110 includes the first port 112, the set of second ports 113a and 113b, and the detection circuit 114. The detection circuit 114 is electrically connected to the power pin, the clock pin, and the system management bus. When receiving the detection command, the hard disk device simulator 110 drives the detection circuit 114 to detect the signals on the power pin, the clock pin and the system management bus, to generate and transmit the detection result. In actual implementation, the first port 112 is used to link the PCIe signals of the two hard disk device simulators 110, which are connected through the cable, so as to link the two digital signal processors 122 which correspond to the two hard disk device simulators 110. In this case, each PCIe downstream port includes a set of registers to indicate the current PCIe status and the PCIe features which the PCIe downstream port can support, and the operating system can obtain the practical link status of the PCIe downstream port by reading the registers, so as to verify the current linking condition of the two insertion slots 121. It is to further explain that, during the process of testing the high frequency signal, various tests can be further performed for the PCIe signal, such as link speed, link width and link speed change. The three test items are implemented by controlling the PCIe downstream port of the DUT 120. The link speed and the link width are taken as examples of the particular test logic, the current status is checked based on the register of the PCIe downstream port, to determine whether the test item is correct. Next, regarding the test on the link speed change, the test program needs to switch between the four statuses of the Gen 4/3/2/1, one by one, by controlling the related register of the PCIe downstream port, so as to verify the link status of the DUT 120 after switching, thereby verifying the compatibility and link stability of the DUT 120 in different speeds.

In addition, the number of the second ports 113a and 113b can be two, one of the second ports 113a and 113b is served as input, and the other of the second ports 113a and 113b is served as output, and the second ports 113a and 113b are serially connected to different hard disk device simulators 110 through transmission lines, and one transmission line is required to connect the test port 123 of the DUT 120 to the second port 113a. It should be particularly noted that each hard disk device simulator includes a unique identifier, so different hard disk device simulator 110 can be identified for communication by addressing. The detection circuit 114 outputs the voltage on the power pin, the accessed bus data, the frequency of the clock signal read through the set of second ports 113a and 113b, as the detection result.

The DUT 120 includes insertion slots 121, a test port 123 and a processing unit 124. Each insertion slot 121 is electrically connected to a digital signal processor 122 corresponding thereto, and when the two hard disk device simulators 110 are respectively inserted into the two insertion slots 121 and the first ports 112 of the two hard disk device simulators 110 are serially connected to each other through the cable 131, the bus signals of two digital signal processors disposed on the DUT 120 and corresponding to the two hard disk device simulators 110 are linked to each other. In actual implementation, the digital signal processor 122 includes a downstream port and a register corresponding to the downstream port, when the test program is executed, the register of the downstream port is read to check the current link status, and switch the link speed one by one and then verify the link status of the hard disk device simulator 110 and the DUT 120 after switching.

The test port 123 is serially connected to the sets of second ports 113a and 113b of the hard disk device simulators 110, which are inserted into the insertion slots 121, through the transmission lines 132. As shown in FIG. 2, the test port 123 is connected to the second port 113a of the hard disk device simulator 110 on lower part of FIG. 2, through the transmission line 132, and the second port 113b of the hard disk device simulator 110 is also connected to the second port 113a of the upper hard disk device simulator 110, through the transmission line 132, and so on. As a result, the hard disk device simulators 110 and the DUT 120 can be serially connected to each other through the transmission lines 132.

The processing unit 124 is electrically connected to the test port 123 and the digital signal processors 122, so that the processing unit 124, the hard disk device simulators 110 serially connected to each other through the cable 131 and inserted into the insertion slots 121, and the digital signal processors 122 corresponding to the hard disk device simulators 110 form a loop. The processing unit 124 executes a test program to read signal link statuses (such as statuses of the PCIe differential signals) of the insertion slots, and transmit the detection command to all of the hard disk device simulators 110, which are serially connected through the transmission lines 132, through the test port 123, and then receive the signal link statuses and the detection results generated by the hard disk device simulators 110, so as to verify and output correctness of the DUT 120. In actual implementation, the processing unit 124 can be implemented by a microcontroller unit (MCU), a microprocessor, a central processing unit (CPU), or a system on a chip (SoC), to execute computer commands, such as detection commands, comparison commands, reading commands or writing command. Testing the PCIe differential signal of the NVMe is taken as an example for description; when the two hard disk device simulators 110 are respectively inserted into the corresponding insertion slots 121 (such as NVMe slots) and the first ports 112 of the two hard disk device simulators 110 are electrically connected to each other through the cable 131, so that the processing unit 124, the two hard disk device simulators 110 and the corresponding digital signal processors 122 can form a loop. In this way, when the processing unit 124 executes the test program, the link between the two PCIe downstream ports can be used to test the PCIe differential signal of NVMe. It should be particularly noted that the above-mentioned test for the PCIe differential signals is irrelevant to the test port 123, and the test port 123 is used to measure the signals on the power pin, the system management bus and the clock pin only.

It is to be particularly noted that, in actual implementation, the modules of the present invention can be implemented by various manners, including software, hardware or any combination thereof, for example, in an embodiment, the module can be implemented by software and hardware, or one of software and hardware. Furthermore, the present invention can be implemented fully or partly based on hardware, for example, one or more module of the system can be implemented by integrated circuit chip, system on chip (SOC), a complex programmable logic device (CPLD), or a field programmable gate array (FPGA). The concept of the present invention can be implemented by a system, a method and/or a computer program. The computer program can include computer-readable storage medium which records computer readable program instructions, and the processor can execute the computer readable program instructions to implement concepts of the present invention. The computer-readable storage medium can be a tangible apparatus for holding and storing the instructions executable of an instruction executing apparatus Computer-readable storage medium can be, but not limited to electronic storage apparatus, magnetic storage apparatus, optical storage apparatus, electromagnetic storage apparatus, semiconductor storage apparatus, or any appropriate combination thereof. More particularly, the computer-readable storage medium can include a hard disk, an RAM memory, a read-only-memory, a flash memory, an optical disk, a floppy disc or any appropriate combination thereof, but this exemplary list is not an exhaustive list. The computer-readable storage medium is not interpreted as the instantaneous signal such a radio wave or other freely propagating electromagnetic wave, or electromagnetic wave propagated through waveguide, or other transmission medium (such as optical signal transmitted through fiber cable), or electric signal transmitted through electric wire. Furthermore, the computer readable program instruction can be downloaded from the computer-readable storage medium to each calculating/processing apparatus, or downloaded through network, such as internet network, local area network, wide area network and/or wireless network, to external computer equipment or external storage apparatus. The network includes copper transmission cable, fiber transmission, wireless transmission, router, firewall, switch, hub and/or gateway. The network card or network interface of each calculating/processing apparatus can receive the computer readable program instructions from network, and forward the computer readable program instruction to store in computer-readable storage medium of each calculating/processing apparatus. The computer program instructions for executing the operation of the present invention can include source code or object code programmed by assembly language instructions, instruction-set-structure instructions, machine instructions, machine-related instructions, micro instructions, firmware instructions or any combination of one or more programming language. The programming language include object oriented programming language, such as Common Lisp, Python, C++, Objective-C, Smalltalk, Delphi, Java, Swift, C#, Perl, Ruby, and PHP, or regular procedural programming language such as C language or similar programming language. The computer readable program instruction can be fully or partially executed in a computer, or executed as independent software, or partially executed in the client-end computer and partially executed in a remote computer, or fully executed in a remote computer or a server.

Figure 3A:
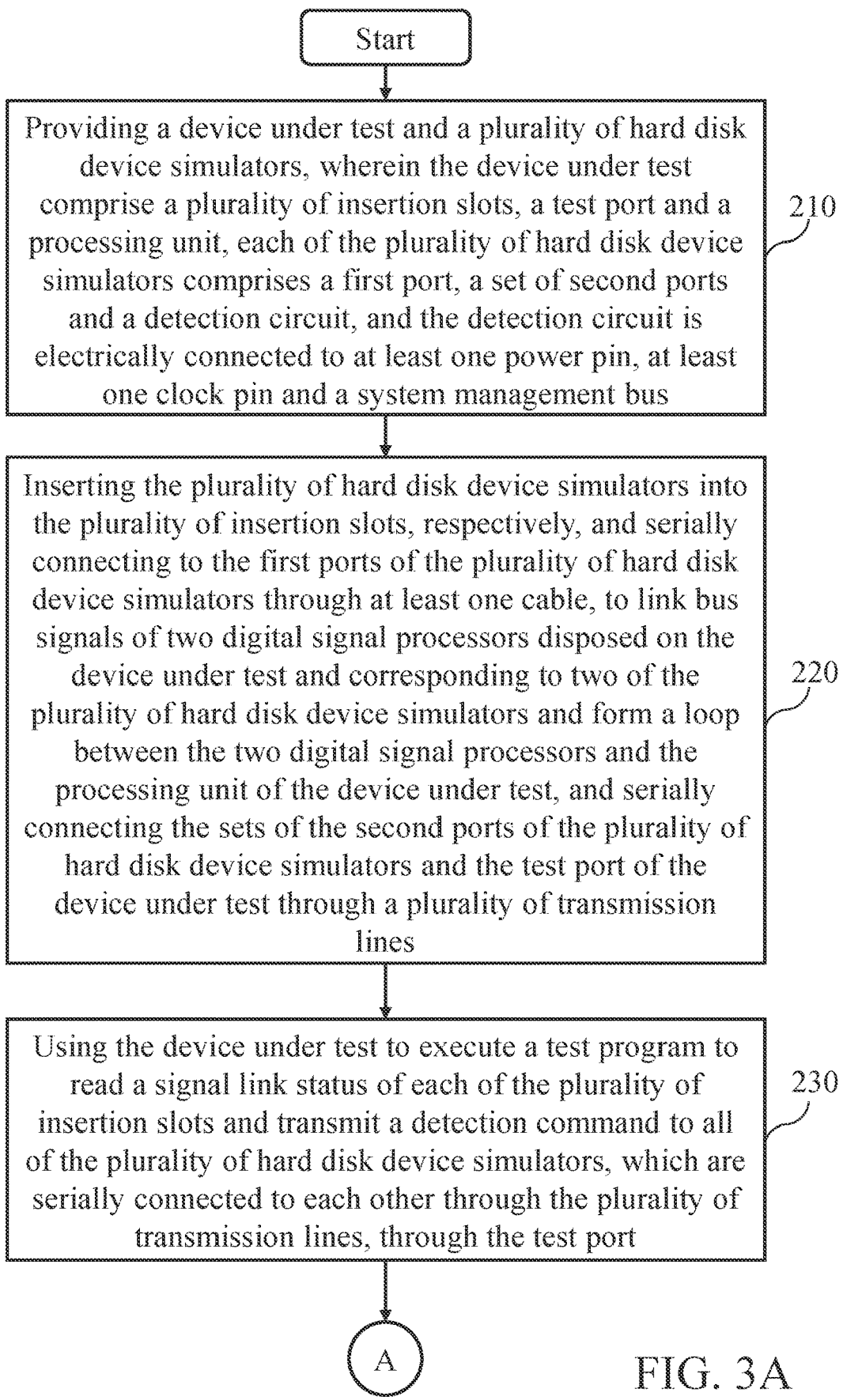
FIGS. 3A and 3B are a flowchart of a testing method using a hard disk device simulator, according to the present invention.
Figure 3B:
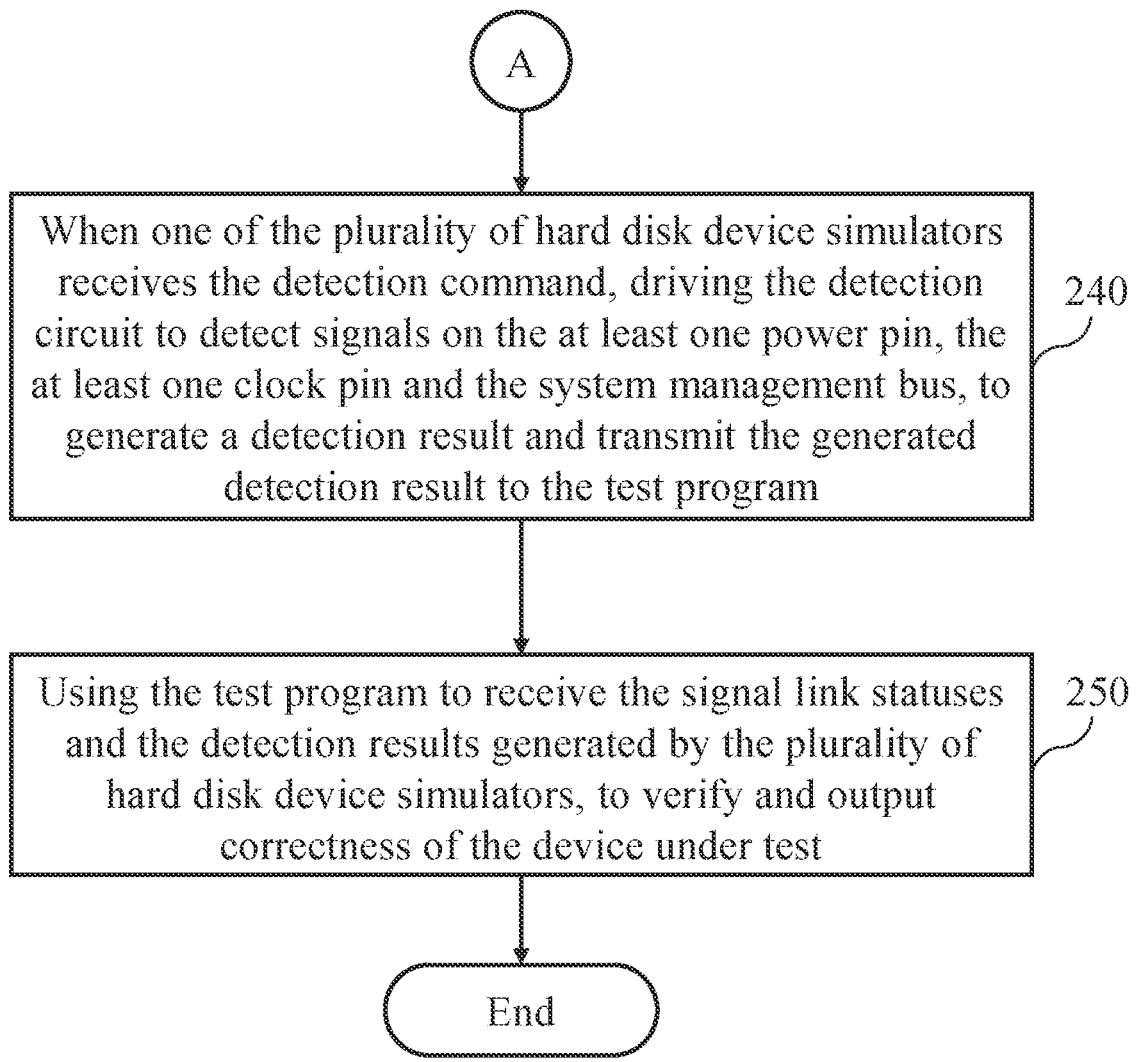

Please refer to FIGS. 3A and 3B, which are a flowchart of a testing method using a hard disk device simulator, according to the present invention. As shown in FIGS. 3A and 3B, the method includes steps 210-250. In the step 210, a device under test (DUT) 120 and hard disk device simulators 110 are provided, the DUT 120 includes insertion slots 121, a test port 123 and a processing unit 124, each hard disk device simulator includes a first port 112, a set of second ports 113*a* and 113*b*, and a detection circuit 114, and the detection circuit 114 is electrically connected to at least one power pin, at least one clock pin and a system management bus. In the step 220, the hard disk device simulators 110 are inserted into the insertion slots 121, respectively, and the first ports 112 of the hard disk device simulators 110 are serially connected through at least one cable 131, make bus signals of two digital signal processors 122 disposed on the DUT 120 and corresponding to the two different hard disk device simulator 110 link, and make the two digital signal processors 122 and the processing unit 124 of the DUT 120 form a loop, and the sets of the second ports 113*a* and 113*b* of the hard disk device simulators 110 and the test port 123 of the DUT 120 are serially connected through transmission lines 132. In the step 230, the DUT 120 executes a test program to read a signal link status of each insertion slot 121 and transmit a detection command to all of the hard disk device simulators 110, which are serially connected to each other through the transmission lines 132, through the test port 123. In the step 240, when the hard disk device simulator 110 receives the detection command, the detection circuit 114 is driven to detect signals on the at least one power pin, the at least one clock pin and the system management bus, to generate a detection result and transmit the generated detection result to the test program. In the step 250, the test program receives the signal link statuses and the detection results generated by the hard disk device simulators 110, to verify and output correctness of the DUT 120.

According to above-mentioned contents, the difference between the present invention and the conventional technology is that the hard disk device simulator having a detection circuit is provided to serially connect to the test port of the device under test, and the test program is executed on the device under test to read the signal link status of the insertion slot of the device under test and transmit the detection command through the test port, to drive the detection circuit of the hard disk device simulator to detect signals on the power pin, the clock pin and the system management bus, so as to generate a detection result, thereby verifying correctness of the device under test based on the signal link status and the detection result. As a result, the above-mentioned technical solution of the present invention is able to solve the convention technology problem and achieve the technical effect of reducing the cost of testing the device under test.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A testing system using hard disk device simulators, and the testing system comprising:
a plurality of hard disk device simulators, wherein each of the plurality of hard disk device simulators comprises a first port, a set of second ports, and a detection circuit, the detection circuit is electrically connected to at least one power pin, at least one clock pin and a system management bus, wherein when receiving a detection command, one of the plurality of hard disk device simulators drives the detection circuit to detect signals on the at least one power pin, the at least one clock pin and the system management bus, to generate and transmit a detection result;
a device under test comprising:
a plurality of insertion slots, wherein one of the plurality of insertion slots is electrically connected to a digital signal processor corresponding thereto, and when the plurality of hard disk device simulators are respectively inserted into the plurality of insertion slots and the plurality of insertion slots are serially connect to the first ports of the plurality of hard disk device simulators through cables respectively, bus signals of the plurality of digital signal processors corresponding to the plurality of hard disk device simulators are linked;
a test port serially connected to the sets of second ports of the plurality of hard disk device simulators respectively inserted to the plurality of insertion slots through a plurality of transmission lines; and
a processing unit electrically connected to the test port and the plurality of digital signal processors, wherein the processing unit, the plurality of hard disk device simulators serially connected through the cables and respectively inserted to the plurality of insertion slots, and the plurality of digital signal processors corresponding to the plurality of hard disk device simulators form a loop, wherein the processing unit executes a test program to read a signal link status on each of the plurality of insertion slots, transmit a detection command to all of the plurality of hard disk device simulators, which are serially connected through the plurality of transmission lines, through a test port, and receive the signal link statuses and the detection results generated by the plurality of hard disk device simulators, to verify and output correctness of the device under test.

2. The testing system using hard disk device simulators according to claim 1, wherein the detection circuit outputs the voltage on the at least one power pin, the accessed bus data and the frequency of the clock signal read through the set of second ports, as the detection result.

3. The testing system using hard disk device simulators according to claim 1, wherein each of the plurality of the hard disk device simulators comprises a unique identifier, and different one of the plurality of hard disk device simulators is identified to communicate by addressing.

4. The testing system using hard disk device simulators according to claim 1, wherein each of the plurality of digital signal processors comprises a downstream port and a register corresponding to the downstream port, and the test program is executed to read the register of the downstream port to check a current link status, and switch a link speed one by one, and verify a link status of the hard disk device simulator and the device under test after the link speed is switched.

* * * * *